United States Patent [19]

Middleton

[11] Patent Number: 4,482,872
[45] Date of Patent: Nov. 13, 1984

[54] SWEPT FREQUENCY OSCILLATORS HAVING TIME CONSTANT-CONTROLLED SIGNAL LEVEL DETECTOR

[75] Inventor: John D. Middleton, Welwyn, England

[73] Assignee: Marconi Instruments Limited, Chelmsford, England

[21] Appl. No.: 328,075

[22] Filed: Dec. 7, 1981

[30] Foreign Application Priority Data

Dec. 9, 1980 [GB] United Kingdom ............... 8039391

[51] Int. Cl.³ ............................................ H03B 23/00
[52] U.S. Cl. ............................... 331/178; 331/177 R; 331/179; 307/271
[58] Field of Search ................... 331/178, 177 R, 179, 331/4, 17; 307/271

[56] References Cited

U.S. PATENT DOCUMENTS 3,638,135 1/1972 Stover ................................. 331/178
3,965,438 6/1976 Winston ............................. 331/178
4,245,196 1/1981 Peebles, Jr. et al. ............... 331/178

Primary Examiner—Stanley D. Miller
Assistant Examiner—B. P. Davis
Attorney, Agent, or Firm—Spencer & Frank

[57] ABSTRACT

A swept frequency oscillator is capable of providing an output signal whose frequency can be swept over a very wide range at a rate which is not dictated by the period of the lowest frequency in the range. The signal detector monitors the output level of the oscillator so as to generate a control signal to remove variations in the output power level. At frequencies below a particular value, the time constant of the detector is modified progressively so as to be inversely proportional to the frequency being generated. Thus at low frequencies in the swept range, the time constant of the detector is increased.

11 Claims, 2 Drawing Figures

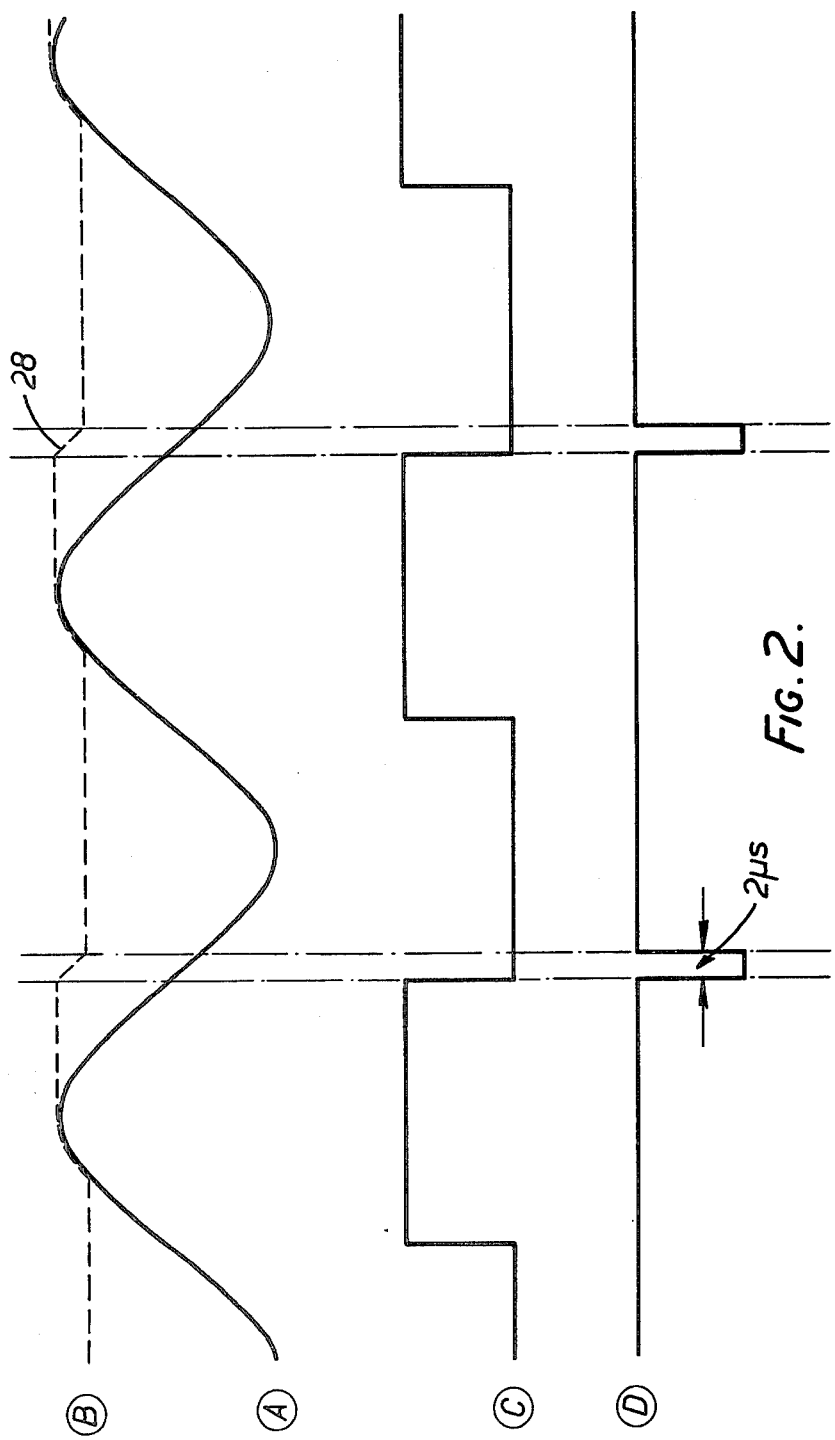

SWEPT FREQUENCY OSCILLATORS HAVING TIME CONSTANT-CONTROLLED SIGNAL LEVEL DETECTOR

BACKGROUND AND SUMMARY OF THE INVENTION

This invention relates to swept Frequency Oscillators. In general, the output power of an oscillator changes as its frequency is varied over its operating band, but it is usually required to produce a substantially constant output power level as the frequency changes. This can be achieved by monitoring the actual output power generated and controlling it by means of a feedback loop so that the level is substantially constant. In order to provide satisfactory operation, the time constant of the power monitor must be large in comparison to the period of the frequency being monitored. This requirement can seriously restrict the sweep rate of a swept frequency oscillator and the difficulty is particularly acute for oscillators which sweep over a very wide frequency range, since the sweep rate is determined by the lowest frequency output of the oscillator. This invention seeks to provide an improved swept frequency oscillator in which this disadvantage is reduced.

According to this invention, a swept frequency oscillator includes a variable frequency oscillator whose output frequency is capable of being swept over a particular frequency range; a signal level detector arranged to monitor the output signal of the variable frequency oscillator; and means operative over at least part of the frequency range of said oscillator for controlling the time constant of the signal level detector in dependence on the actual frequency value, so that the time constant is at least approximately inversely related to the frequency value.

The invention is particularly applicable to swept frequency oscillators, which sweep over a very wide frequency range. For example, spectrum analysers generally include a swept frequency oscillator and it may be required to sweep from typically less than 100 Hz up to 1 GHz. The power level of the output signal generated by the swept oscillator is chosen primarily in relation to the power handling capability of the circuit or instrument to which the variable frequency is being fed, and to enable accurate measurements to be performed the output level of the swept frequency oscillator must be held at a predetermined constant value irrespective of the frequency. It is common to detect the power level by means of a suitable level detector, such as a diode, and to compare a d.c. control signal generated at the diode with a reference voltage. Any resulting difference signal is indicative of an error in power level and is amplified and applied to a gain controlling element associated with the source of the oscillation, so as to level the output signal by normal feedback action. It is necessary for an integrating time constant to be associated with the level detector, so that the feedback loop does not follow the cyclic amplitude variations of the frequency currently being generated. In practice, this means that the time constant of the level detector must be many times the period of the frequency being monitored. It will be appreciated that at the low end of the frequency band when a signal of about 100 Hz is being generated that the period of the signal is 10 milliseconds and consequently, the time constant associated with the level detector may be as long as 1000 milliseconds. A consequence of this is that the rate at which the oscillator output changes frequency must be relatively slow, since otherwise the frequency would change at a rate which was too rapid for the level detector to respond to in a satisfactory manner. This difficulty is reduced in accordance with the present invention.

BRIEF DESCRIPTION OF THE DRAWINGS

A swept frequency oscillator in accordance with the present invention is further described by way of example with reference to the accompanying drawing in which, FIG. 2 is an explanatory diagram.

DESCRIPTION OF THE PREFERRED EMBODIMENT

Figure 1:
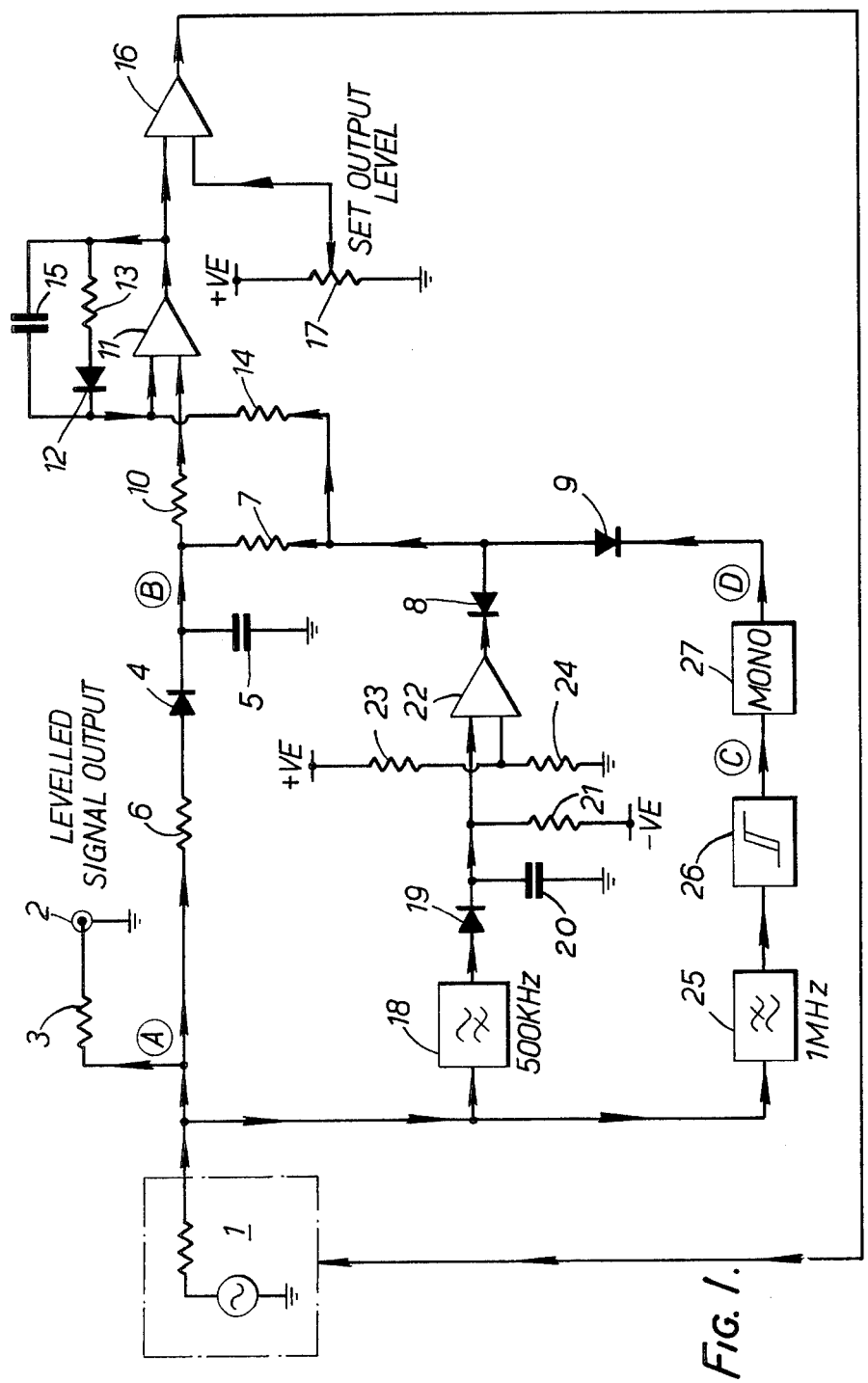
FIG. 1 shows an oscillator in accordance with the invention.

Referring to FIG. 1, a variable frequency oscillator 1 provides a variable frequency to an output terminal 2 via a resistor 3. The output level is monitored by means of a signal detector comprising a diode 4 and a capacitor 5, resistor 6 being included to permit high frequency lift. The capacitor 5 charges rapidly as the diode 4 becomes conductive when the output level rises, and is discharged via resistor 7 and diodes 8 or 9. The voltage on capacitor 5 is fed via r.f. hold-off resistor 10 to one input of a unity gain amplifier 11. Feedback components 12 and 13 and bleed resistor 14 ensure that the standing d.c. voltage drop across resistor 6 and diode 4 due to current taken via resistor 7 is duplicated at the other input of the unity gain amplifier 11. In this way the output from amplifier 11 is only dependent on the r.f. signal and is not a function of the d.c. voltage drop across resistor 6 and diode 4. Capacitor 15 is included to integrate the current pulses from resistor 14 (which arise in a manner explained subsequently).

The voltage from amplifier 11 is compared at a comparator 16 with a selectable d.c. level produced by potentiometer 17. The potentiometer 17 generates a reference level which corresponds to the required output power level and if the rectified signal from amplifier 11 differs from the reference value, a control signal is generated at the output of the comparator 16 and is used to modify the level of the swept frequency source 1, so as to reduce the error.

The output signal of the oscillator 1 is also fed to a high pass filter 18 having a cut-off frequency of about 500 kHz. The output of the filter 18 is fed via a further detector 19 and a smoothing circuit comprising a capacitor 20 and a resistor 21 to one input of a further comparator 22. The other input of the comparator 22 is connected to a reference potential determined by the relative values of resistors 23 and 24, which constitute a potential divider. The output of the comparator 22 is coupled via a switchable diode 8 to the resistor 7. The output signal of the oscillator 1 is also coupled to a low pass filter 25 having a cut-off value of about 1 MHz. The output of the filter 25 is fed via a Schmitt trigger 26 to the trigger input of a monostable 27. The output of the monostable 27 is connected to control the conduction of a further switchable diode 9.

The circuit is operative to provide a substantially constant smoothing time constant for the diode 4 above the frequency of 500 kHz determined by the cut-off value of the high pass filter 18. Below this frequency the time constant is modified so that it is substantially inversely proportional to the actual value of the frequency.

Above this frequency of 500 kHz, the action of the diode 19 and the capacitor 20 is such as to produce a positive potential at the junction point of the discharge resistor 21 and the capacitor 20 which exceeds the fixed potential bias produced by the potential divider consisting of resistors 23 and 24. The comparator 22 is such that under this condition its output is highly negative thereby causing diode 8 to conduct so that the discharge resistor 7 determines the time constant of the discharge path of capacitor 5.

Thus at frequencies above 500 kHz, the detector 4 functions in a conventional manner to level the output power of the variable frequency oscillator 1. Typically, the time constant associated with the capacitor 20 and the resistor 21 is about 20 microseconds, whilst the time constant of the capacitor 5 and the resistor 7 is about ten times as long.

Below the cut-off frequency of 500 kHz, the low pass filter 18 reduces the level of the signal at diode 19, so that the detected signal level at the comparator 22 is less than the fixed bias voltage determined by the resistors 23 and 24. Thus the output of the comparator 22 is positive under this condition, thereby rendering diode 8 non-conductive.

At frequencies below 1 MHz, the low pass filter 25 transmits sufficient signal to exceed the threshold level of the Schmitt trigger circuit 26. Schmitt trigger circuits are well known devices and they operate to provide a very rapid output transition from one level to another when the input signal crosses its input threshold value. They are thus able to provide a rapid and definable output level from a slowly varying input signal level. The transition in the output level of the Schmitt trigger 26 is arranged to trigger the monostable circuit 27 causing it to produce a negative going pulse having a duration of two microseconds.

It will thus be apparent that when diode 8 becomes non-conductive, the diode 9 is conducting intermittently so as to at least partially discharge capacitor 5 via resistor 7. As the input frequency decreases below 500 kHz, the diode 9 and resistor 7 are alternately switched on and off at the signal rate with the off time progressively increasing so as to decrease the average discharge current value. Because the pulse width of the monostable circuit 27 has a fixed value the mean current flowing through the resistor 7 under this condition is inversely proportional to frequency. Thus the effective time constant of the detector 4 is inversely proportional to frequency. For example, at 100 Hz the time constant associated with the detector 4 has increased to the required value of one second from the fixed value of 200 microseconds, which is obtained at frequencies above 500 kHz.

A consequence of varying the mean value of the discharge current through resistor 7 is that the output current through diode 4 varies with frequency.

This causes a voltage drop across resistor 6 and diode 4. This would cause an error in the detected output were it not for the fact that resistor 14 produces the same current through diode 12 and resistor 13. This current is smoothed by capacitor 15 so that the original error is cancelled at the differential input amplifier 11.

Signal waveforms occurring at various points in the circuit, as identified by letters A, B, C, D, are illustrated in FIG. 2 for an output frequency which is less than 500 kHz. The waveform A represents the output signal of oscillator 1. It will be seen that the voltage on the capacitor 5, as represented by waveform B, follows rapidly increases in signal level, but the voltage decays more slowly at a rate determined by the mean current flowing through resistor 7. At frequencies below 1 MHz the variations in the individual cycles of the oscillator output A are fed to the Schmitt trigger 26 (waveform C) so as to trigger the monostable 27 at the output frequency rate and at frequencies below 500 kHz the operation of the monostable renders the discharge current path of resistor 7 intermittently conductive. The voltage ramp 28 occurs whilst diode 9 is actually conductive.

In order to enhance the stability of the feedback loop which controls the output level of the oscillator 1, it may be desirable to include a loop filter between the output of the comparator 16 and the control input point of the oscillator 1, and it may be advantageous to provide a filter whose frequency characteristics tracks the output frequency of the oscillator.

The frequency of the output signal of the oscillator 1 is determined in a conventional manner by a frequency control signal, but this aspect of the circuit is omitted from FIG. 1.

I claim:

1. A swept frequency oscillator, comprising a variable frequency oscillator whose output frequency is capable of being swept over a particular frequency range; a signal level detector means for monitoring the amplitude of the output signal of the variable frequency oscillator; and means operative over at least part of the frequency range of said oscillator for controlling the time constant of the signal level detector means in dependence on the actual frequency value, so that the time constant is at least approximately inversely related to the frequency value.

2. An oscillator at claimed in claim 1, wherein said means operative over at least part of the frequency range of said oscillator comprises means operative below a predetermined frequency for increasing the time constant of the signal level detector means by reducing the magnitude of the mean discharge current of the signal level detector means.

3. An oscillator as claimed in claim 2, wherein the signal level detector means comprises a capacitor which is charged via a diode which is rendered intermittently conductive in step with the output frequency of the oscillator, and wherein said means operative below a predetermined frequency comprises means for discharging said capacitor via a current path which is rendered intermittently conductive at the same rate.

4. An oscillator as claimed in claim 3, wherein said means operative below a predetermined frequency comprises means for rendering said current path conductive for a fixed duration during each cycle of the output frequency irrespective of the value output frequency.

5. An oscillator as claimed in claim 4, wherein said means for rendering said current path conductive comprises a diode, and means for triggering said diode into conduction during each cycle of the output frequency when the cyclic variation of amplitude in the output frequency exceeds a predetermined trigger amplitude.

6. A swept frequency oscillator, comprising:
a variable frequency oscillator having an amplitude control input;
first means, having a time constant, for temporarily storing a voltage corresponding to the amplitude of the output signal of the variable frequency oscillator;

second means, connected between the first means and the amplitude control input of the variable frequency oscillator, for keeping the amplitude of the output signal of the variable frequency oscillator substantially constant; and third means responsive to the output signal of the variable frequency oscillator and communicating with the first means via a discharge path for controlling the time constant of the first means in dependence on the actual frequency of the output signal of the variable frequency oscillator when said output signal is below a predetermined frequency so that the time constant is substantially inversely related to the frequency when the frequency is below said predetermined value.

7. The oscillator of claim 6, wherein said third means comprises means for reducing mean current through said discharge path when the output signal of the variable frequency oscillator is below said predetermined frequency.

8. The oscillator of claim 7, wherein said means for reducing the means current through said discharge path comprises means for rendering said discharge path substantially non-conductive except for a period of fixed duration during each cycle of the output signal of the variable frequency oscillator when said output signal is below said predetermined frequency.

9. The oscillator of claim 8, wherein said discharge path comprises a first resistor having a first lead connected to said first means and a second lead, and wherein said means for rendering said discharge path substantially non-conductive except for a period of fixed duration during each cycle comprises a first diode connected to the second lead of the first resistor, and means for triggering said first diode into conduction during each cycle of the output signal of the variable frequency oscillator when said output signal is below said predetermined frequency.

10. The oscillator of claim 9, wherein said second means comprises an amplifier having a first input communicating with said first means and a second input, a second resistor and a second diode series-connected between the second input and the output of the amplifier, and a third resistor connecting the second lead of said first resistor and the second input of the amplifier.

11. The oscillator of claim 10, further comprising a high-pass filter having an input connected to the output of said variable frequency oscillator, a third diode having an input connected to the output of the high-pass filter and an output connected to a smoothing circuit, means for comparing the voltage across said smoothing circuit and a reference voltage, and a fourth diode connecting the output of the means for comparing and the second lead of said first resistor.

* * * * *